United States Patent [19]
Muroyama

[11] Patent Number: 5,314,710
[45] Date of Patent: May 24, 1994

[54] INSULATION LAYER FORMING METHOD

[75] Inventor: Masakazu Muroyama, Kanagawa, Japan

[73] Assignee: Sony Corporation, Tokyo, Japan

[21] Appl. No.: 954,344

[22] Filed: Sep. 30, 1992

[30] Foreign Application Priority Data

Oct. 2, 1991 [JP] Japan .................................. 3-254003
Oct. 30, 1991 [JP] Japan .................................. 3-283432
Aug. 13, 1992 [JP] Japan .................................. 4-215326

[51] Int. Cl.$^5$ .............................................. B05D 5/12
[52] U.S. Cl. .................... 427/96; 427/430.1; 427/443.2
[58] Field of Search .................. 427/96, 443.2, 430.1

[56] References Cited

FOREIGN PATENT DOCUMENTS

WO91/00780 1/1991 PCT Int'l Appl.

OTHER PUBLICATIONS

*Patent Abstracts of Japan,* vol. 012, No. 324, (E-653), of Japanese Published Application No. 63-090137 (1988), Sep. 2, 1988.
*Patent Abstracts of Japan,* vol. 015, No. 153 (P1191), of Japanese Published Application No. 30-24550 (1991) Apr. 17, 1991.
*Database WPI,* Section Ch, Week 4278, Derwent Publications Ltd, London, G.B., Class A, AN 78-75397, & JP-A-53105377 (Sep. 13, 1978).
*Database WPI,* Section Ch, Week 4779, Derwent Publication Ltd, London, G.B., Class A, AN 79-85335, & JP-A-54133881 (Oct. 17, 1979).

*Primary Examiner*—Shrive Beck
*Assistant Examiner*—David M. Maiorana
*Attorney, Agent, or Firm*—Hill, Steadman & Simpson

[57] ABSTRACT

An insulation layer forming method for processing a substrate having a first surface area covered with a photo resist mask pattern and a second surface area uncovered with the photo resist mask pattern to form an SiO2 insulation layer on the second surface area of the substrate. The method comprises the steps of dipping the substrate in an organic solvent having no compatibility with water and photo resist, recirculating the organic solvent under heat to remove water from the substrate, solving an organic silicone compound in the organic solvent, and recirculating the organic solvent having the organic silicone compound under heat to form the SiO2 insulation layer while removing a by-product.

14 Claims, 7 Drawing Sheets

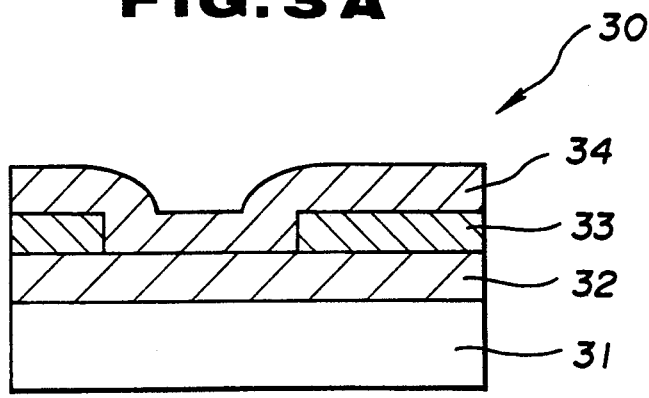
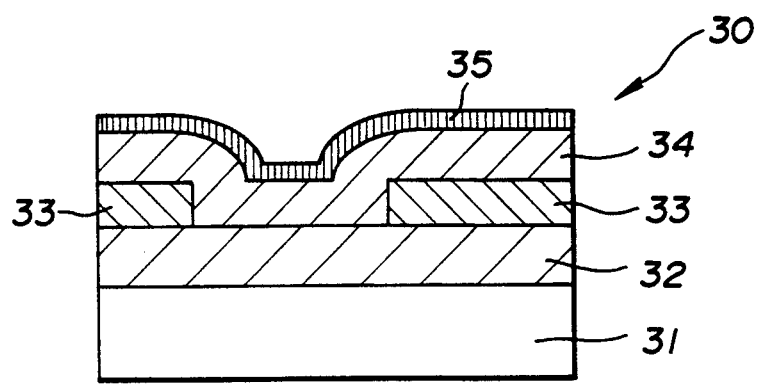
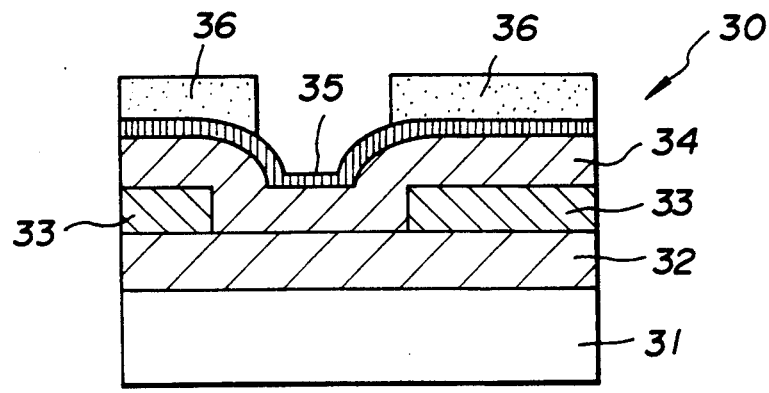

5,314,710

INSULATION LAYER FORMING METHOD

BACKGROUND OF THE INVENTION

This invention relates to an insulation layer forming method for processing a substrate having a first surface area covered with a photo resist mask pattern and a second surface area uncovered with the photo resist mask pattern to form an insulation layer on the second surface area of the substrate.

It is the common practice to form an insulating layer so as to provide a high degree of flatness over the whole surface area of a wiring layer having a wiring pattern. For this purpose, a solution growth method has been proposed where organometallic alkoxide is made to react in a nonaqueous solvent to form the insulating layer. One serious problem associated with such a solution growth method is the tendency of the solvent to enter the junction between the wiring layer and the photo resist mask so as to separate the photo resist mask from the wiring laker. This separation will degrade the flatness of the insulating layer. In addition, the solvent enters to swell the photo resist layer residual on the wiring layer.

SUMMARY OF THE INVENTION

Therefore, it is a main object of the invention to provide an improved insulation layer forming method which can form an insulating layer to provide a desirable degree of flatness on the whole surface area of the wiring layer.

There is provided, in accordance with the invention, an insulation layer forming method for processing a substrate having a first surface area covered with a photo resist mask pattern and a second surface area uncovered with the photo resist mask pattern to form siloxane insulation layer on the second surface ar e substrate. The method comprises the steps of dipping the substrate in an organic solvent having no compatibility with water and photo resist, recirculating the organic solvent under heat to remove water from the substrate, solving an organic silicone compound in the organic solvent, and recirculating the organic solvent having the organic silicone compound under heat to form siloxane insulation layer while removing a by-product.

BRIEF DESCRIPTION OF THE DRAWINGS

This invention will be described in greater detail by reference to the following description taken in connection with the accompanying drawings, in which like reference numerals refer to the same or corresponding parts, and wherein:

FIGS. 3A, 3B, 3C, 3D, 3E are sectional views used in explaining an insulating layer forming process made in Example 2;

DETAILED DESCRIPTION OF THE INVENTION

Prior to the description of the preferred embodiment of the present invention, the insulation layer forming method on which the present invention is an improvement will be described in order to specifically point out the difficulties attendant thereon.

Figure 6A:
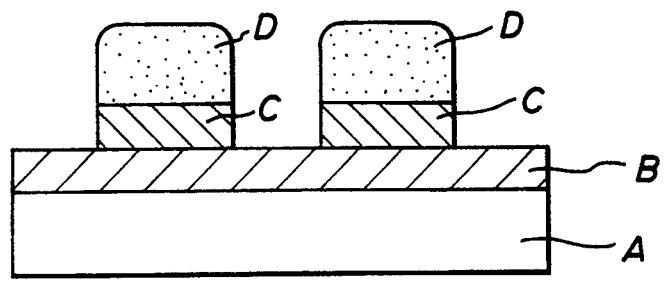
FIGS 6A, 6B, 6C are sectional views used in explaining an insulating layer forming process on which the present invention is an improvement.
Figure 6B:
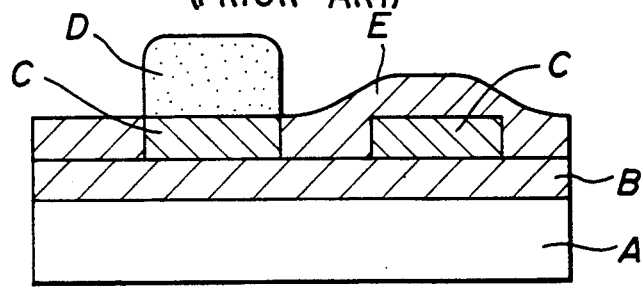
Figure 6C:
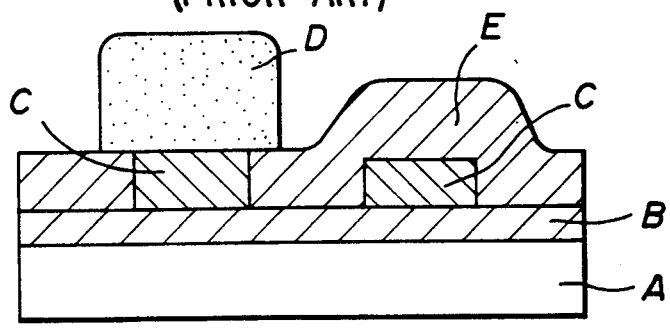

FIG. 6A shows a semiconductor wafer having a silicon substrate A, an insulating layer B, a wiring layer C and a photo resist layer D. The wiring layer C is processed by an etching technique. If a solution growth method is used to form an insulating film E, the ortho xylene solvent will permeate into the interface between the wiring layer C and the photo resist layer D to separate the photo resist layer D from the wiring layer C. Since the force of adhesion of the photo resist layer D to the wiring layer C is dependent on the van der Waals force, the affinity between the photo resist layer D and the metal wiring layer C is small. For this reason, the insulating layer E is formed to have different levels so as to degrade the flatness of the insulating layer E, as shown in FIG. 6B. In addition, the ortho xylene solvent also permeate into the novolak resin contained in the photo resist layer D to swell the photo resist layer, as shown in FIG. 6C.

According to the invention, it is possible to prevent the photo resist layer D from swelling and separating from the wiring layer C.

Figure 1:
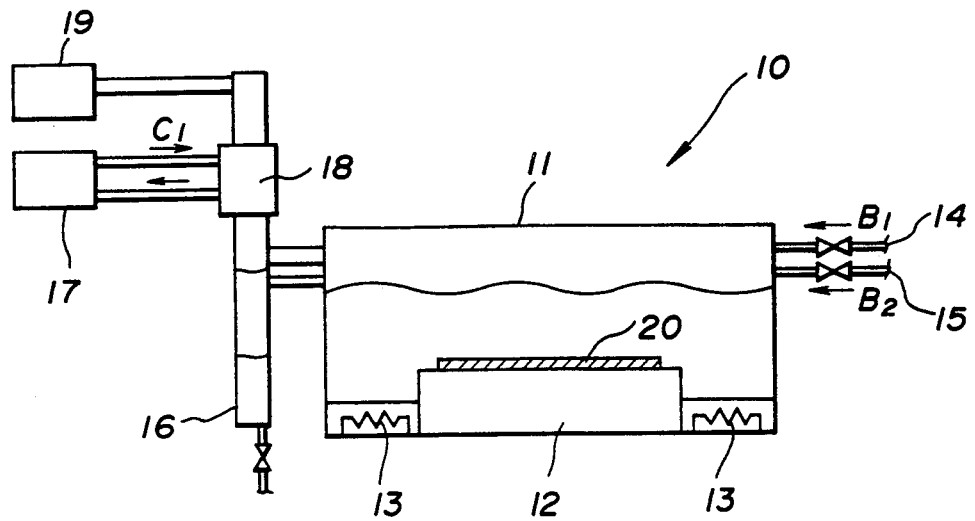
FIG. 1 is a schematic diagram showing a solution reactor used for forming an insulating layer according to the present invention.

Referring to FIG. 1, there is shown a solution reactor used in embodying the present invention. While the shown solution reactor is of the single wafer type, it will be appreciated that this insulating film forming method can be used with other types of solution reactors. The solution reactor, generally designated by the numeral 10, includes a reaction vessel 11 which contains a wafer table 12 for supporting a wafer to be processed. Heaters 13 is placed within the reaction vessel 11 around the wafer table 12. A treatment agent is introduced into the reaction vessel 11 through an agent conduit 14 in a direction indicated by arrow B1. A solvent is introduced into the reaction vessel 11 through a solvent conduit 15 in a direction indicated by arrow B2. A trap 16 is connected to the reaction vessel 11 for separation of surface absorption water and by-products in the course of the solution reactions. A coolant is recirculated from a cooling unit such as a chiller 17 in a direction indicated by arrow C1 through a cooling pipe 18 looped around the trap 16 for recirculating the solvent. An exhaust unit 19 is connected to the trap 16 for controlling the pressure in the reaction vessel 11.

The insulation film forming method of the invention will be described further in connection with the following Examples:

EXAMPLE 1

Figure 2A:
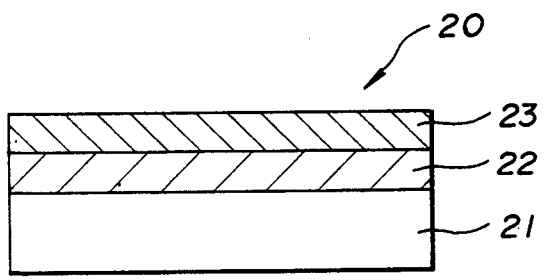
FIGS. 2A, 2B, 2C, 2D, 2E are sectional views used in explaining an insulating layer forming process made in Example 1.

This example will be described in connection with a process for providing a sufficient degree of flatness between Al wiring layers. The used semiconductor wafer 20 has a silicon substrate 21, siloxane layer insulation layer 22 and an Al wiring layer 23 laminated in this order, as shown in FIG. 2A. The semiconductor wafer 20 was placed on the wafer table 12. A hydrophobic solvent such as ortho xylene was introduced through the solvent conduit 15 into the reaction vessel 11 so that the semiconductor wafer 20 was dipped under the solvent. The amount of the solvent introduced into the reaction vessel 11 was $5 \times 10^{-4} m^3$. The heaters 13 were powered to maintain the solvent at its boiling point (145° C.). The evaporated solvent flows into the trap 16 where it is liquidized by the coolant flowing around the trap 16. The liquidized solvent was recirculated again into the reaction vessel 11. Under this condition, the surface absorption water having no compatibility with ortho xylene is separated in the trap 16 due to the specific gravity difference. The solvent was recirculated for about one hour until the water absorption water was completely separated from the solvent.

Figure 2B:
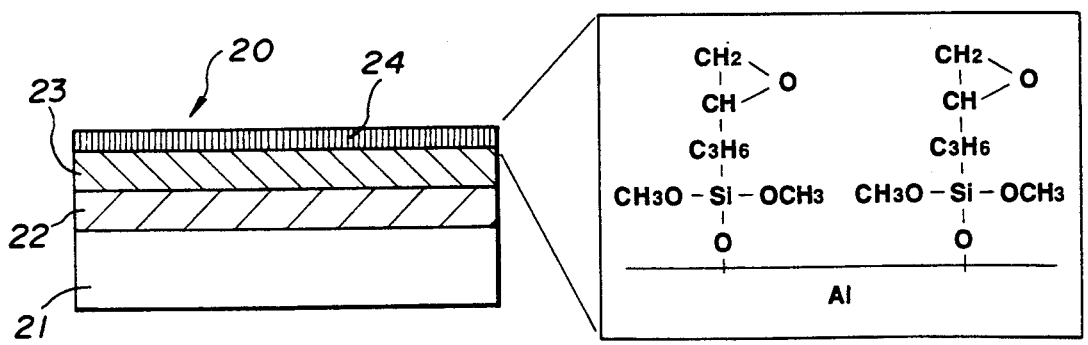
Figure 2C:
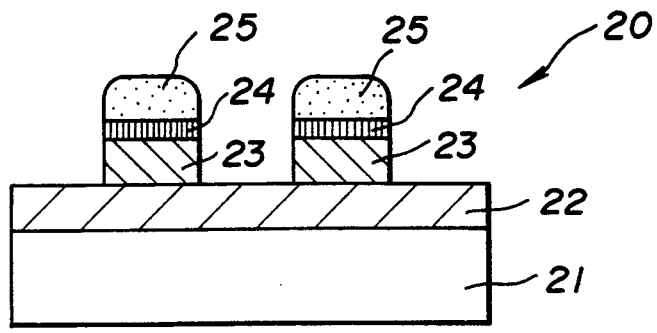

Following this, γ-epoxy propyl triethoxy silane (5g) was added to the solvent. The solvent mixed with the γ-epoxy propyl triethoxy silane was recirculated for one hour to form an adhesion layer (γ-epoxy propyl triethoxy silane layer) 24, as shown in FIG. 2B. The γ-epoxy propyl triethoxy silane has function groups including an alkoxy silane group and an epoxy group. The Al wiring layer 23 was processed with the use of a photo resist mask 25, as shown in FIG. 2C. Following this, UV illumination has applied over the whole surface area of the semiconductor wafer 20 so that the photosensitive agent contained in the photo resist molecules can produce a carboxyl group in such a manner as expressed by the following chemical formula (1):

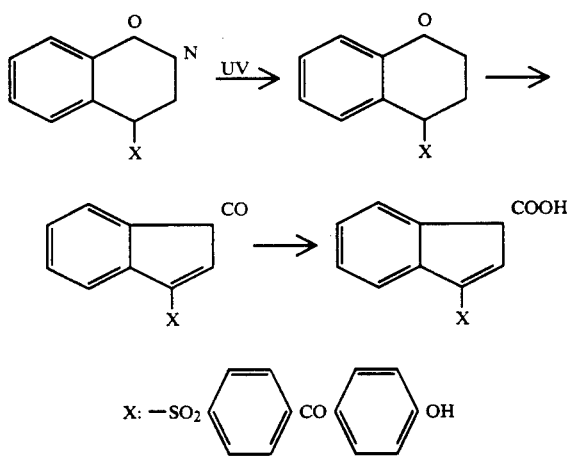

The carboxyl group reacts with the epoxy group included in the adhesion layer 24 deposited above the Al wiring layer 23 to produce a chemical bond or combination in such a manner as expressed by the following chemical formula (2):

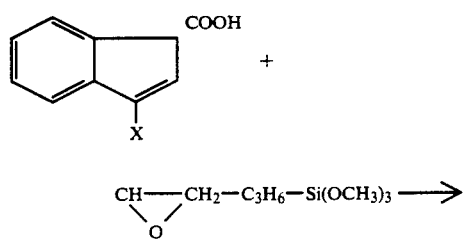

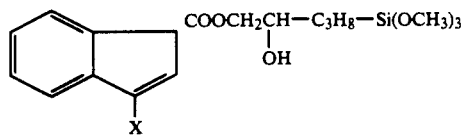

The chemical combination improves the force of adhesion between the Al wiring layer 23 and the photo resist layer 25 to a remarkable extent.

Figure 2D:
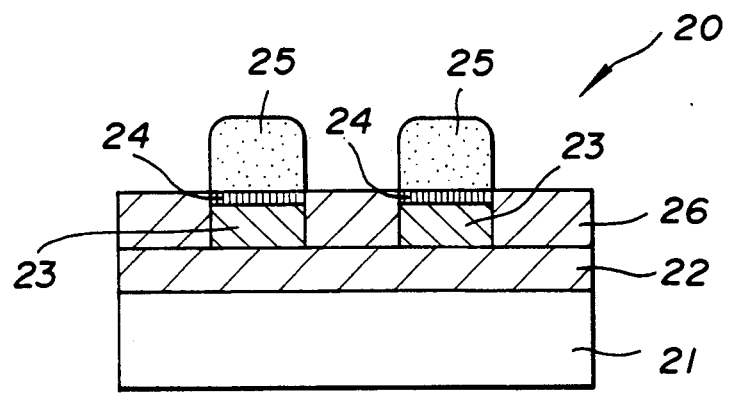
Figure 2E:
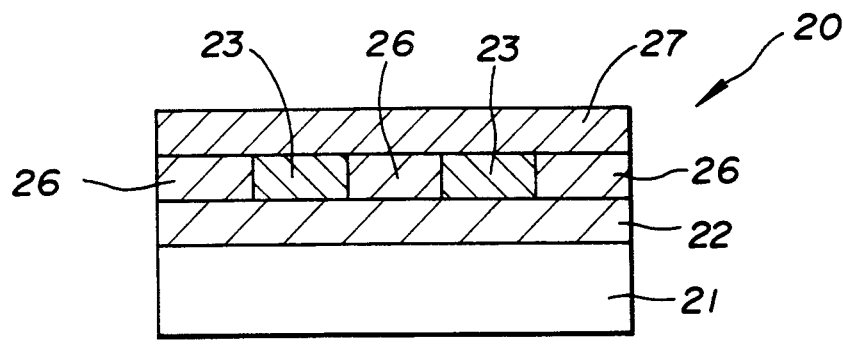

The solution reactor 10 was used to form a layer insulation layer 26 with the ortho xylene solution of tetra ethoxy silane according to the solution reaction method. The layer insulation layer 26 has a high degree of flatness, as shown in FIG. 2D. After an ashing technique was used to remove the photo resist layer 25, a plasma CVD was applied from a parallel plate type plasma CVD device to form a layer insulation film 27 so as to provide a predetermined thickness, as shown in FIG. 2E. The plasma CVD conditions were as follows:

Gas and Gas Flow Rate
tetra ethoxy silane (TEOS) . . . 350 SCCM
oxygen (O₂) . . . 350 SCCM
Pressure . . . 10 Torr
Temperature . . . 390° C.
RF Power . . . 350 W The solvent used in the solution reaction method may be selected from hydrophobic solvents having a boiling point higher than that of the by-products such as ethanol and water. For example, the solvent may be ortho xylene, cyclo octanone or the like.

Although tetra ethoxy silane is used to form the layer insulating layer, it is to be understood that an organometallic compound may be used in Place of the tetra ethoxy silane. For example, the organometallic compound includes OMCTS (octa methyl cyclo tetra siloxane), TPOS (tetra propoxy silane) or TMCTS (tetra methyl cyclo tetra siloxane).

EXAMPLE 2

Figure 3D:
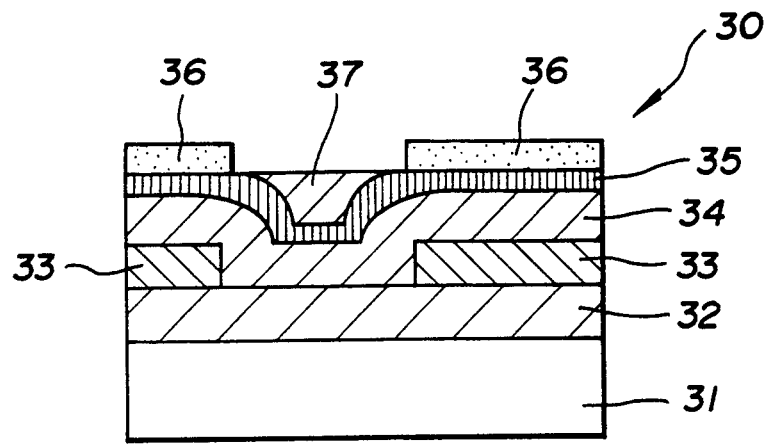
Figure 3E:
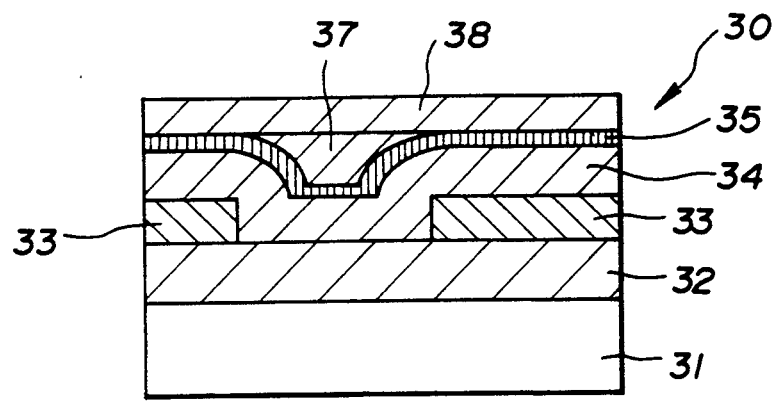

This example will be described in connection with a process for forming a layer insulating layer. The used semiconductor wafer 30 has a silicon substrate 31, siloxane insulation layer 32, an Al wiring layer 33, and a siloxane insulation layer 34 laminated in this order, as shown in FIG. 3A. In the same manner as described in connection with the Example 1, a hydrophobic solvent such as ortho xylene was introduced into the reaction vessel 11 so that the semiconductor wafer 30 was dipped under the solvent. The heaters 13 was powered to maintain the solvent at its boiling point (145° C.). Under this condition, γ-ethyleneimine propyl triethoxy silane (5g) was added to the solvent. The solvent mixed with the γ-epoxy propyl triethoxy silane was recirculated for one hour to form an adhesion layer (γ-ethyleneimine propyl triethoxy silane layer) 35, as shown in FIG. 3B. The γ-ethyleneimine propyl triethoxy silane has function groups including an alkoxy silane group and an ethyleneimine group. A photo resist layer 36 was formed on the adhesion layer 35, as shown in FIG. 3C. Following this, UV illumination was applied over the whole surface area of the semiconductor wafer 30 so that the photosensitive agent contained in the photo resist molecules can produce a carboxyl group in such a manner as expressed by the chemical formula (1). The carboxyl group reacts with the ethyleneimine group contained in the wiring layer 33 to produce a chemical combination. The chemical combination improves the force of adhesion between the wiring layer 33 and the photo resist layer 36 to a remarkable extent. Following this, the ortho xylene solution of the tetra ethoxy silane was used, according to the solution reaction method, to form a flatting layer 37, as shown in FIG. 3D. After an ashing technique was used to remove the photo resist layer 36, a layer 38 may be formed to provide a predetermined thickness, as shown in FIG. 3E, if required.

EXAMPLE 3

Figure 4A:
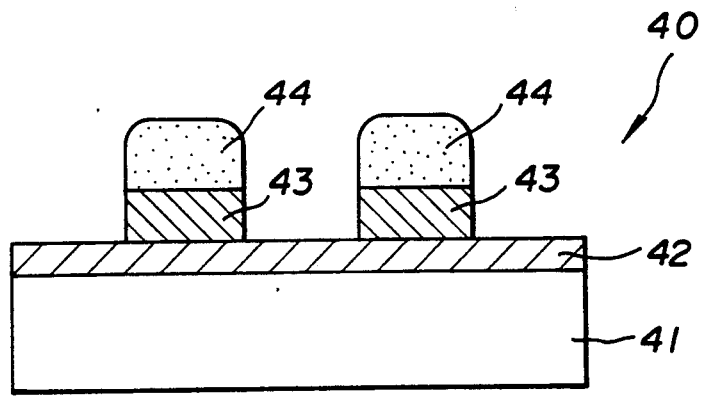
FIGS. 4A, 4B, 4C are sectional views used in explaining an insulating layer forming process made in Example 3.

This example will be described in connection with a process for flatting the Al wiring layer. The used semiconductor wafer 40 has a silicon substrate 41, a siloxane layer 42, and an Al wiring layer 43 laminated in this order. A photo resist layer 44 is formed above the Al wiring layer 43, the Al wiring layer 43 was etched, as shown in FIG. 4A.

The surface absorption water was removed from the semiconductor wafer surface in the following manner; The semiconductor wafer 40 was placed on the wafer table 12. A hydrophobic solvent such as ortho xylene was introduced into the reaction vessel 11 so that the semiconductor wafer 40 was dipped under the solvent. The amount of the solvent introduced into the reaction vessel 11 was $5 \times 10^{-4}$ m$^3$. The exhaust device 19 was operated to reduce the pressure in the reaction vessel 11. to 28000 [Pa] (210 [Torr]). It is possible to recirculate the solvent (ortho xylene) at 100° C. under this reduced pressure. The heaters 13 were powered to maintain the solvent at its boiling point (100° C.). Under this condition, the surface absorption water is evaporated at 67° C. The solvent including the evaporated absorption water was liquidized in the trap 16 by the coolant flowing around the trap 16. The liquidized solvent was recirculated again into the reaction vessel 11. Under this condition, the surface absorption water having no compatibility with ortho xylene is separated in the trap 16 due to the specific gravity difference. The solvent was recirculated for about one hour until the water absorption water was completely separated from the solvent. If the surface absorption water remains in the solvent, a problem will result from particles collected on the photo resist layer 44 since the organometallic alkoxide (organic silicon compound) such as tetra ethoxy silane to be added will react in the solvent according to the following chemical formula (3):

$$SI\,(OC_2H_3)_4 + 2H_2O \rightarrow SIO_2 + 4C_2H_3OH$$

Figure 4B:
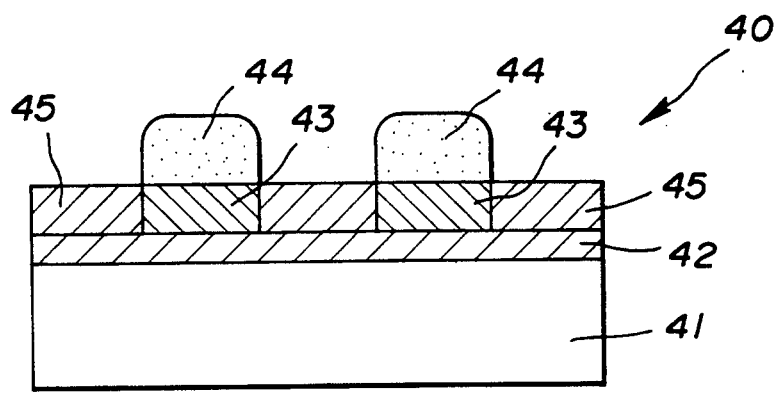

After the separated surface absorption water is discharged from the trap 16 through a drain (not shown), tetra ethoxy silane (for example, 5g) was added to the solvent. The solvent wets recirculated under the pressure of 28000 [Pa](210 [Torr]) to form a layer insulating layer 45, as shown in FIG. 4B, according to the following chemical formula (4):

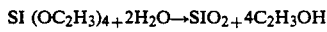

The insulating layer 46 is formed by the reactions of the substrate with tetra ethoxy silane ("TEOS"). In the first equation above, the hydroxyl groups on the substrate react with TEOS. Then, as seen in the second equation above, the formed siloxane compound further reacts with TEOS to form a linear siloxane chain. This siloxane chain constitutes the insulating layer.

Figure 4C:
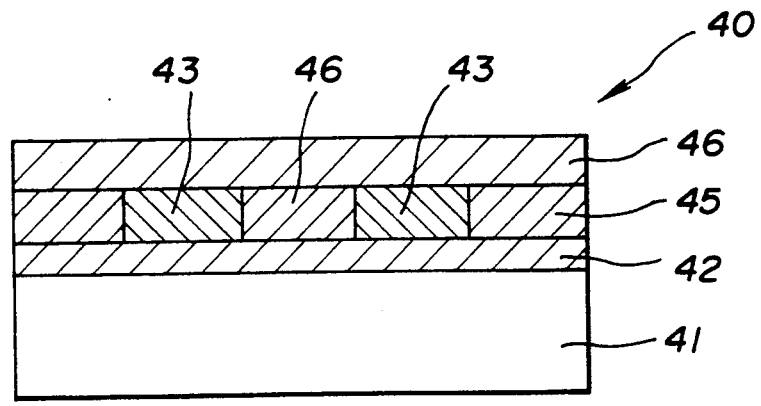

After an ashing technique was used to remove the photo resist layer 44, an insulating layer 46 was formed to provide a predetermined thickness. The insulating layer 46 may be formed, as shown in FIG. 4C, by a parallel plate type plasma CVD technique under the following conditions:

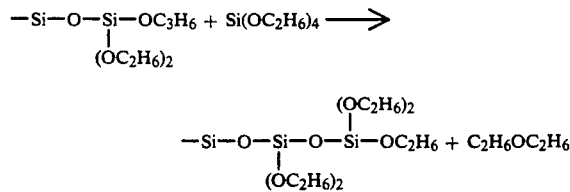

Gas and Gas Flow Rate
TEOS/O2 . . . 350/350 [sccm]
Pressure . . . 1330 [Pa] (10 [Torr])
Temperature . . . 390° C.
RF Power . . . 350 W The solvent used in the solution reaction method may be selected from hydrophobic solvents having a boiling point higher than that of the by-products such as ethanol and water. For example, the solvent may be ortho xylene, cyclo octanone or the like.

Although tetra ethoxy silane is used to form the layer insulating layer, it is to be understood that an organometallic alkoxide may be used in place of the tetra ethoxy silane. For example, the organometallic compound includes OMCTS (octa methyl cyclo tetra siloxane), TPOS (tetra propoxy silane) or TMCTS (tetra methyl cyclo tetra siloxane) may be used in place of tetra ethoxy silane.

EXAMPLE 4

Figure 5A:
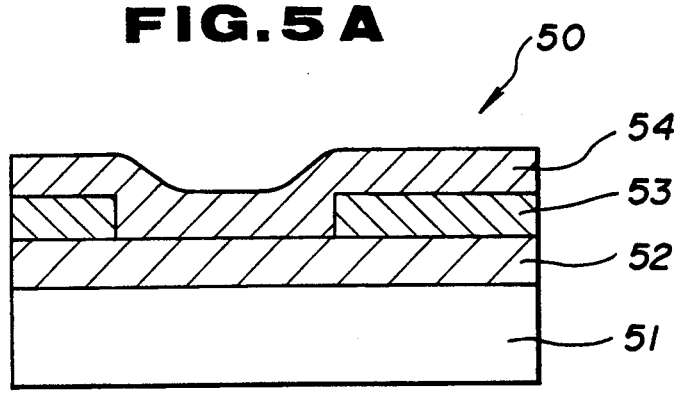
FIGS 5A, 5B, 5C, 5D are sectional views used in explaining an insulating layer forming process made in Example 4.
Figure 5B:
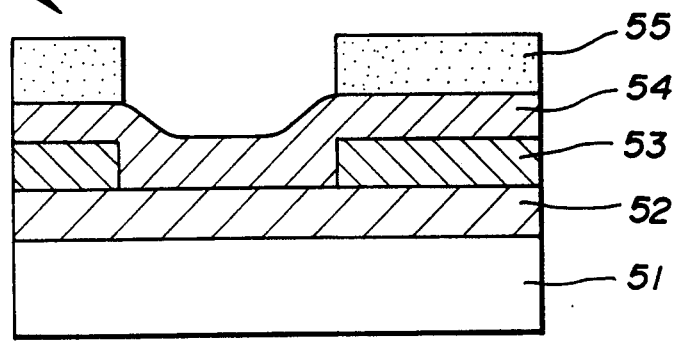

This example will be described in connection with a process for forming a layer insulation layer. The removal of the surface absorption water was made at a relatively high temperature in order to prevent the photo resist mask from swelling and exfoliating. The pressure in the reaction vessel 11 was reduced to permit a temperature redubtion during solution reactions since the by-product has a low boiling point. The used semiconductor wafer 50 has a silicon substrate 51, a siloxane insulating layer 52, an Al wiring layer 53, and a siloxane insulating layer 54 laminated in this order, as shown in FIG. 5A. A photo resist layer 55 was formed on the insulating layer 54, as shown in FIG. 5B. In the same manner as described in connection with Example 1, a hydrophobic solvent such as ortho xylene was introduced into the reaction vessel 11 so that the semiconductor wafer 50 was dipped under the solvent. The amount of the solvent introduced into the reaction vessel 11 was $5 \times 10^{-4}$ m$^3$. The exhaust device 19 was operated to reduce the pressure in the reaction vessel 11. to 28000 [Pal (210 [Torr]). It is possible to recirculate the solvent (ortho xylene) at 100° C. under this reduced pressure. The heaters 13 were powered to maintain the solvent at its boiling point (100° C.). Under this condition, the surface absorption water is evaporated at 67° C. The solvent including the evaporated absorption water was liquidized in the trap 16 by the coolant flowing around the trap 16. The liquidized solvent was recirculated again into the reaction vessel 11. Under this condition, the surface absorption water having no compatibility with ortho xylene is separated in the trap 16 due to the specific gravity difference. The solvent was recirculated for about one hour until the water absorption water was completely separated from the solvent.

Figure 5C:
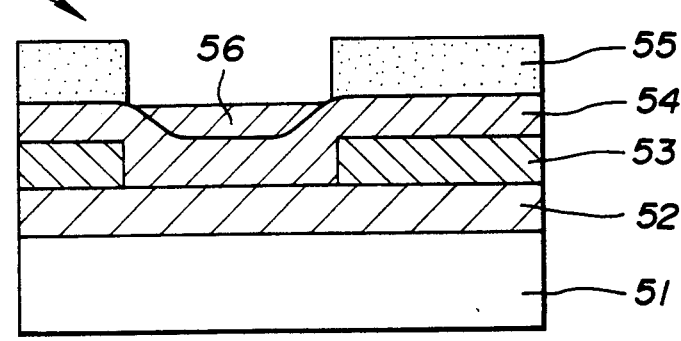
Figure 5D:
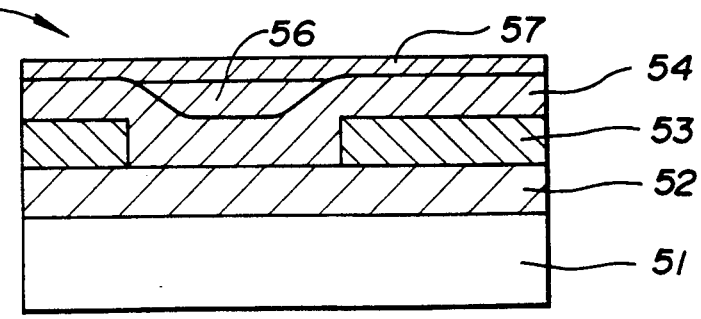

Following this, tetra ethoxy silane (for example, 5g) was added. In order to reduce the reaction temperature so as to prevent the photo resist layer 55 from swelling, the pressure in the reaction vessel 21 was reduced to 3990 [Pa](30 [Torr]). Under this reduced pressure, the solvent was recirculated at 50° C. to form a siloxane flatting layer 56, as shown in FIG. 5C. The by-products include ethanol and diethyl ether. Ethanol has a boiling point (11.5° C. under this pressure) higher than that of the other by-product. The silicon oxide film forming reaction proceeds in a stable manner because of the dealcohol and deether reactions of the tetra ethoxy silane. The reaction temperature reduction caused no problem. After an ashing technique was used to remove the photo resist layer 56, an insulation layer 57 may be formed to provide a predetermined thickness, as shown in FIG. 5D, if required.

If the solvent is recirculated under a pressure ranging from several ten Torr to atmospheric pressure, the reaction temperature can be reduced. This is effective to prevent the photo resist mask from swelling and separating.

According to the invention, an adhesion layer is formed to improve the force of adhesion between the photo resist mask and the insulating layer. This is effective to prevent the photo resist mask from swelling and separating even though the solution reaction process continues for a long time. It is, therefore, possible to certainly form a flat layer insulation layer at a high rate between wiring patterns having a high aspect ratio.

While this invention has been described in conjunction with specific embodiments thereof, it is evident that many alternatives, modifications and variations will be apparent to those skilled in the art. Accordingly, it is intended to embrace all alternatives, modifications and variations that fall within the scope of the appended claims.

What is claimed is:

1. An insulation layer forming method for processing a substrate having a first surface area covered with a photo resist mask pattern and a second surface area uncovered with the photo resist mask pattern to form a siloxane insulation layer on the second surface area of the substrate, the method comprising the steps of:

dipping the substrate in an organic solvent having no compatibility with water and photo resist;

recirculating the organic solvent under heat to remove water from substrate;

solving an organic silicone compound in the organic solvent; and recirculating the organic solvent having the organic silicon compound under heat to form the siloxane insulation layer while removing a by-product.

2. The insulation layer forming method as claimed in claim 1, wherein an adhesion layer is formed between the photo resist mask pattern and the substrate, the adhesion layer being chemically combinable with a component of the photo resist mask.

3. The insulation layer forming method as claimed in claim 2, wherein the adhesion layer is made of a compound having functional groups including alkoxy silane and epoxy groups.

4. The insulation layer forming method as claimed in claim 2, wherein the adhesion layer is made of a compound having functional groups including alkoxy silane and ethyleneimine groups.

5. The insulation layer forming method as claimed in claim 2, wherein the solvent is recirculated under a reduced pressure condition.

6. The insulation layer forming method as claimed in claim 2, wherein the solvent is recirculated under a reduced pressure condition ranging from several ten Torrs to atmospheric pressure.

7. The insulation layer forming method as claimed in claim 2, wherein the organic solvent is ortho-xylene.

8. The insulation layer forming method as claimed in claim 2, wherein the organic silicon compound is selected from a group consisting tetra ethoxy silane (TEOS), tetra propoxy silane (TPOS), octa methyl cyclo tetra siloxane (OMCYS) and tetra methyl cyclo tetra siloxane (TMXTS).

9. The insulation layer forming method as claimed in claim 2, wherein the by-product is alcohol.

10. The insulation layer forming method as claimed in claim 1, wherein the solvent is recirculated under a reduced pressure condition.

11. The insulation layer forming method as claimed in claim 1, wherein the solvent is recirculated under a reduced pressure condition ranging from several ten Torrs to atmospheric pressure.

12. The insulation layer forming method as claimed in claim 1, wherein the organic solvent is ortho-xylene.

13. The insulation layer forming method as claimed in claim 1, wherein the organic silicon compound is selected from a group consisting tetra ethoxy silane (TEOS), tetra propoxy silane (TPOS), octa methyl cyclo tetra siloxane (OMCYS) and tetra methyl cyclo tetra siloxane (TMXTS).

14. The insulation layer forming method as claimed in claim 1, wherein the by-product is alcohol.

* * * * *